United States Patent
Tang et al.

(10) Patent No.: US 7,764,279 B2
(45) Date of Patent: Jul. 27, 2010

(54) PIXLE CIRCUIT SYSTEM FOR A LIGHT EMITTING DISPLAY

(75) Inventors: Yu-Chun Tang, Kaohsiung Hsien (TW); Li-Wei Shih, Chia Yi Hsien (TW)

(73) Assignee: AU Optronics Corp., Hsinchu (TW)

( * ) Notice: Subject to any disclaimer, the term of this patent is extended or adjusted under 35 U.S.C. 154(b) by 841 days.

(21) Appl. No.: 11/480,882

(22) Filed: Jul. 6, 2006

(65) Prior Publication Data
US 2007/0007535 A1    Jan. 11, 2007

(30) Foreign Application Priority Data
Jul. 8, 2005    (TW) .............................. 94123127 A

(51) Int. Cl.
G09G 5/00    (2006.01)
(52) U.S. Cl. .................. 345/204; 345/205; 345/206; 345/211
(58) Field of Classification Search ............. 345/76–83, 345/90, 92, 169.1, 169.3, 204, 149, 156, 345/97, 211, 205, 206; 257/336, 334, 408, 257/72, 352, 359, 57, 59, 61, 66, 67, 69, 257/70, 401, 291, 351, 382, 337, 435, 549, 257/E21, E29.278, E29.151, E29.435, E51.005, 257/E29.012, E27.111, E29.137, E29.267, 257/E29.299; 349/43, 110; 438/149, 142, 438/30, 166, 151, 44, 197, 230–232, 301–307, 438/158, 154; 315/169.1, 169.3
See application file for complete search history.

(56) References Cited

U.S. PATENT DOCUMENTS

| | | | | |
|---|---|---|---|---|
| 5,412,493 A | * | 5/1995 | Kunii et al. ................... 349/43 |
| 6,096,585 A | * | 8/2000 | Fukuda et al. ............... 438/154 |
| 6,670,641 B1 | * | 12/2003 | Fukuda et al. ................ 257/66 |
| 6,713,748 B1 | * | 3/2004 | Tsutsumi et al. .......... 250/208.1 |
| 7,132,685 B2 | * | 11/2006 | Chen ............................ 257/57 |
| 7,132,690 B2 | * | 11/2006 | Lee et al. ...................... 257/72 |
| 7,592,628 B2 | * | 9/2009 | Morimoto et al. ............. 257/72 |
| 2003/0059986 A1 | * | 3/2003 | Shibata ...................... 438/149 |
| 2003/0207482 A1 | * | 11/2003 | Lu .............................. 438/29 |
| 2004/0089862 A1 | * | 5/2004 | Kimura ....................... 257/59 |
| 2005/0098783 A1 | * | 5/2005 | Kimura ....................... 257/59 |
| 2005/0242349 A1 | * | 11/2005 | Lee et al. ...................... 257/59 |
| 2006/0081946 A1 | * | 4/2006 | Yanai et al. ................. 257/392 |
| 2007/0007535 A1 | * | 1/2007 | Tang et al. .................... 257/72 |
| 2007/0200139 A1 | * | 8/2007 | Shibata et al. .............. 257/146 |
| 2009/0290082 A1 | * | 11/2009 | Yamazaki et al. ............. 349/43 |

FOREIGN PATENT DOCUMENTS

| | | |
|---|---|---|
| CN | 1585137 A | 2/2005 |
| CN | 1588516 A | 3/2005 |
| TW | 582118 | 4/1992 |

* cited by examiner

*Primary Examiner*—Prabodh M Dharia
(74) *Attorney, Agent, or Firm*—Birch, Stewart, Kolasch & Birch, LLP

(57) ABSTRACT

A pixel circuit for driving a plurality of pixel units within a display includes: a plurality of scanning lines formed within the display for transmitting scanning signals to the pixel units; a plurality of data lines formed within the display and transversely crossing the scanning lines for transmitting data signals to the pixel units, respectively; and a plurality of LDD-TFTs. The LDD-TFT is coupled to a respective scanning line, a respective data line and a driving transistor. The LDD-TFT includes a first lightly doped drain that is closest to the driving transistor and that has a first length, and a second lightly doped drain that has a second length shorter than the first length.

10 Claims, 2 Drawing Sheets

US 7,764,279 B2

PIXLE CIRCUIT SYSTEM FOR A LIGHT EMITTING DISPLAY

FIELD OF THE INVENTION

The present invention relates to a lightly doped drain thin film transistor (LDD-TFT) structure, more particularly to a LDD-TFT in pixel circuit of a display device.

BACKGROUND OF THE INVENTION

Due to rapid advance in the semiconductor fabrication technology, the thin film transistor (TFT) structure can be manufactured in compact size more than ever. As a result, the channel region formed between the source and drain of a TFT structure is accordingly reduced in the length. Decrease in the length of the channel region results in decrease of the threshold voltage, the leakage current from the conventional TFT structure and the hot electron effects, a total of which affects the operational performance of the conventional TFT structure. In order to remedy the above mentioned problem, a lightly doped drain (LDD) structure is proposed in the prior art so as to reduce the electric field at the junction of the drain, thereby lowering the hot electron effects.

A large amount of TFTs are employed during the designing of the pixel circuit and the peripheral driving circuit within an organic light emitting display (OLED). Since the function and the operational conditions of the pixel circuit and the peripheral driving circuit are different from each other, the characteristics required by the TFTs also differ. To the pixel circuit end, the TFT structure serves as a switch for permitting flow of current therethrough in order to control the performance of gray scale of the OLED. Therefore, for maintaining the performance of the light emitting display in the normal condition (standard condition), it is preferable to reduce the leakage current from the TFT structure.

FIG. 1 shows a sectional view of a conventional lightly doped drain thin film transistor (LDD-TFT) structure. The LDD-TFT 10 includes a substrate 12, a semiconductor layer 14 deposited on the substrate 12, a gate insulating (dielectric) layer 16 deposited on the semiconductor layer 14, and a gate electrode 18 deposited on the gate insulating layer 16. The semiconductor layer 14 includes two lightly doped drains 140, 142 and two sources/drains 144, 146 respectively disposed on left and right sides of the lightly doped drains 140, 142 and symmetric under the gate 18. A channel region 148 is defined between the lightly doped drains 140, 142. N-type impurities are used to form the lightly doped drain regions for reducing the leakage current from the conventional LDD-TFT structure 10 so as to avoid the hot electron effects around the sources/drains 144, 146 regions caused due to the high electrical field.

The lightly doped drains 140, 142 respectively have higher resistance than the sources/drains 144, 146 due to low dopant concentration. Therefore, the total resistance of series resistors of the sources/drains 144, 146 will be increased to cause the lower electron drift speed and the lower operation speed of the whole device. Under this condition, the operation speed of component must be sacrificed inevitably if one wishes to improve the leakage current problem of the conventional TFT structure. During the designing of the LDD-TFT structure, the trade-off between the characteristics of the electron drift speed or the leakage current is an essential factor should be taken.

FIG. 2 shows a pixel circuit of a display which serves as the drive circuit in a conventional active matrix light emitting display. The pixel circuit comprises a dual gate LDD-TFT N1, a data line D1, a scan line S1, a driving transistor P1, a capacitor C1, and a light emitting diode (LED) L1. The dual gate LDD-TFT N1 has a source coupled to the data line D1 and a gate coupled to the scanning line S1. The driving transistor P1 has a gate coupled to the drain of the dual gate LDD-TFT N1. The capacitor C1 has a first end coupled to the source of the dual gate LDD-TFT N1 and the gate of the driving transistor P1. The LED L1 has a positive end coupled to the drain of the driving transistor P1.

When the scan line S1 is driven, the dual gate LDD-TFT N1 is switched on and the signal from the data line D1 is inputted to the capacitor C1 and the gate of the driving transistor P1. Then the driving transistor P1 drives the LED L1 to control the performance of the gray scale.

The absence of the scanning signal from the scanning line S1 results in switching off the dual gate LDD-TFT N1, and the potential at a node B is low. At this condition, the electric charge of the capacitor is high potential to maintain the driving transistor P1 in the switch-off state, and the potential at a node A is high. Thus, a current leaks out from the node A toward the node B due to the potential of the node A higher than the potential of the node B.

Therefore, the present invention is to find a way to improve the structure of the components in the pixel circuit for reducing the amount of leakage current in the pixel circuit.

SUMMARY OF THE INVENTION

The object of the present invention is to improve the structure of the components in the pixel circuit so as to reduce the amount of leakage current therefrom.

Another object of the present invention is to provide a dual gate transistor having different lengths of the lightly doped drains so as to reduce the series resistance between the source and the drains of the dual gate transistor to avoid the low speed of the dual gate transistor.

In one aspect of the present invention, a pixel circuit is proposed for driving a plurality of pixel units within a display. The pixel circuit includes: a plurality of scanning lines disposed to be formed within the display device for transmitting scanning signals to the pixel units; a plurality of data lines disposed to be formed within the display transversely crossing the scanning lines for transmitting data signals to the pixel units, respectively; a plurality of lightly doped drain thin film transistors (LDD-TFT). The one of LDD-TFTs is coupled to a respective scanning line, a respective data line and a driving transistor. The LDD-TFT includes a first lightly doped drain that is closest to the driving transistor and that has a first length, and a second lightly doped drain has a second length shorter than the first length.

The present invention is employing the lightly doped drain to reduce the leakage current. The series resistor between the source and the drain can be decreased while the lightly doped drain of the transistor close to the drain is canceled or reduced the length, so as to raise the speed of the electron drift and the operation speed of the transistor.

BRIEF DESCRIPTION OF THE DRAWINGS

Other features and advantages of this invention will become more apparent in the following detailed description of the preferred embodiments of this invention, with reference to the accompanying drawings, in which.

DETAILED DESCRIPTIONS OF THE PREFERRED EMBODIMENTS

Figure 1:
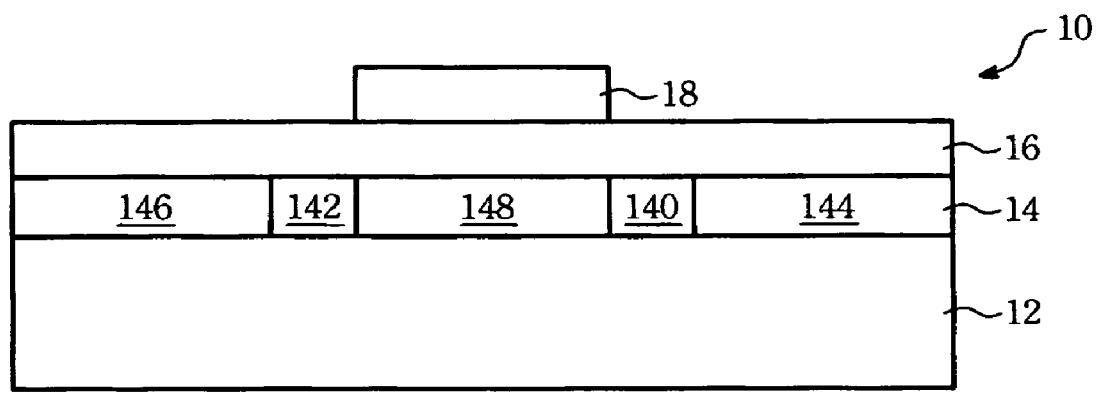
FIG. 1 shows a sectional view of a conventional LDD-TFT structure.
Figure 2:
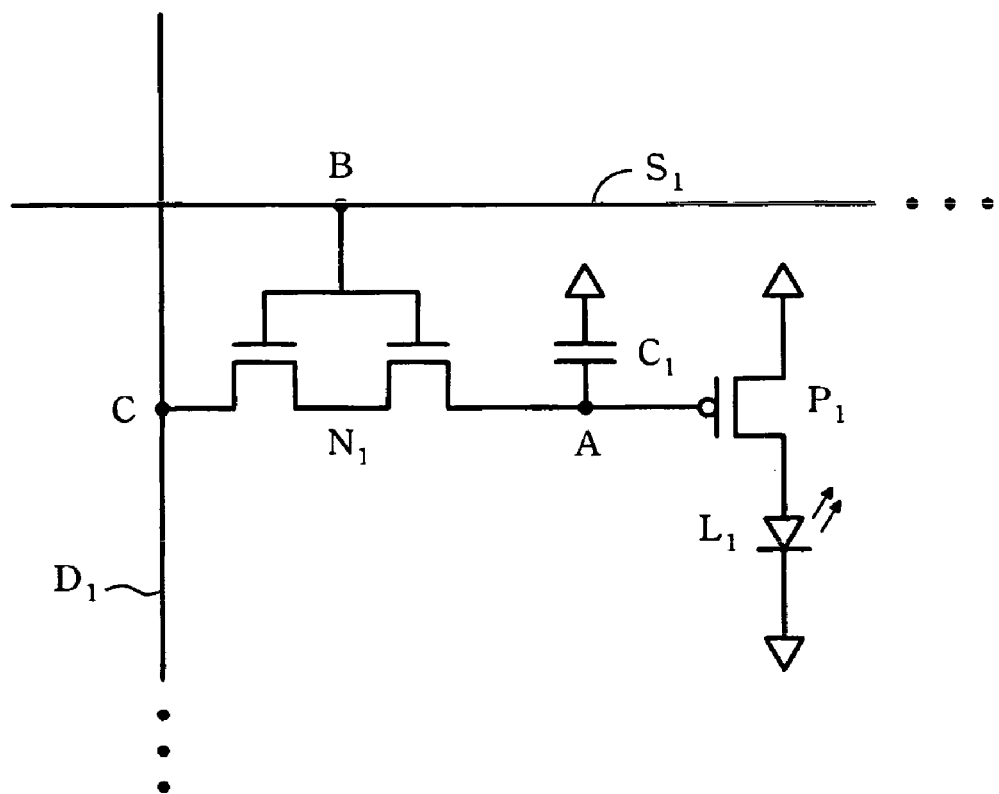
FIG. 2 shows a pixel circuit unit of a conventional display device.

Referring to FIG. 3A, it illustrates a preferred embodiment of a pixel unit in accordance with the present invention. The pixel circuit is applied to a driving circuit of an active matrix light emitting display which is driving by the current and has a plurality of pixel units. The pixel unit comprises a data line D1, a scan line S1, a dual gate thin film transistor (TFT) N2, a driving transistor P1, a capacitor C1, and a light emitting diode (LED) L1. The drain of the dual gate TFT N2 is connected to the data line D1, the gate of the dual gate TFT N2 is connected to the scan line S1, and the source of the dual gate TFT N2 is connected to the gate of the driving transistor P1. One terminal of the capacitor C1 is connected to the source of the dual gate TFT N2 and the gate of the driving transistor P1. The anode of the LED L1 is connected to the drain of the driving transistor P1.

Referring to FIG. 3B, it illustrates a dual gate TFT having asymmetric lightly doped drains in accordance with the present invention. It is noted in this embodiment illustrated is a dual gate TFT N2, however, an n-type TFT can also be applied. The dual gate TFT N2 comprises a substrate 22, a semiconductor layer 24 deposited on the substrate 22, an insulating layer 26 deposited on the semiconductor layer 24, and dual gates 28 deposited on the insulating layer 26.

The dual gates 28 are composed with a first gate 281 and a second gate 282, and the semiconductor layer 24 comprises a source 241, a first lightly doped drain 240, a first channel region 247, a second lightly doped drain 242, a drain/source 243, a third lightly doped drain 244, a second channel region 249, a fourth lightly doped drain 246, and a drain 245 arranged in turn. The first channel region 247 is formed between the first and the second lightly doped drains 240, 242 and located under the first gate 281. The second channel region 249 is formed between the third and the fourth lightly doped drains 244, 246 and located under the second gate 282. The first lightly doped drain 240 is closest to the driving transistor P1 and has the longest length than other lightly doped drains 242, 244, 246.

In the structure of the dual gate TFT N2, as illustrated in FIG. 3B, the first and the second gates have two side walls respectively and overlap the parts of the lightly doped drains. However, it is optional to have the side walls of the gates overlap the parts of the lightly doped drains, and the relative location regarding to the gates and the lightly doped drains can be disposed arbitrarily according to the requirement of the electric design of the component.

Figure 3:
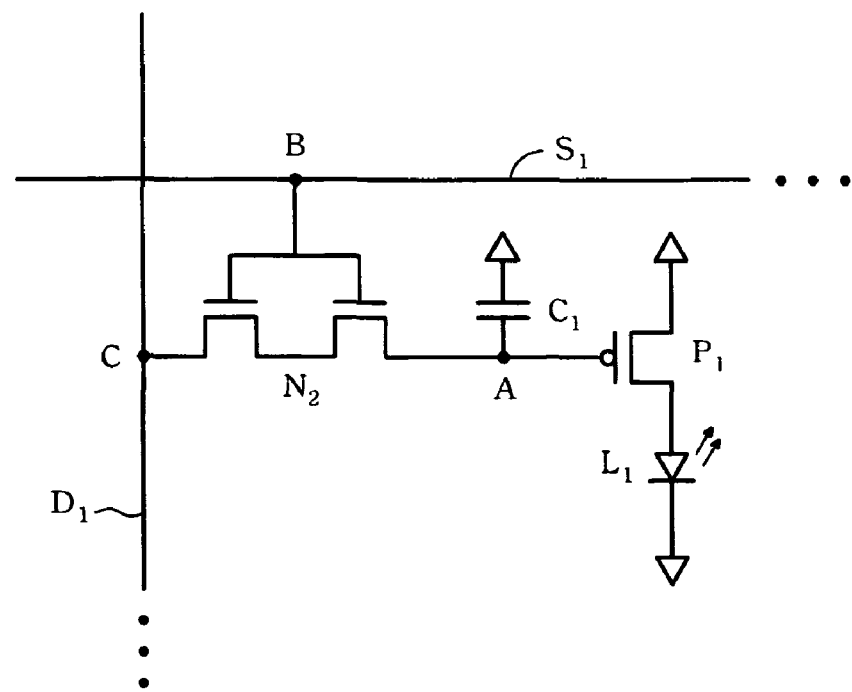
FIG. 3A show a pixel circuit of the present invention.
FIG. 3B shows a sectional view of an LDD-TFT structure of the present invention.
Figure 3:
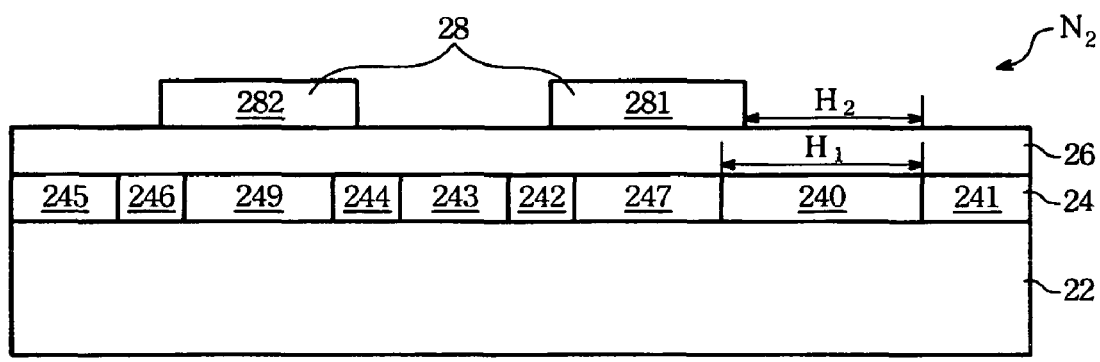

Generally speaking, there are two manner to measure the length of the lightly doped drain. As shown in FIG. 3, one manner is to measure the distance between two ends of the first lightly doped drain 240 and to define the length of the lightly doped drain to be H1, the other manner is to measure the distance between one end of the first gate 281 and one end of the first lightly doped drain and to define the length of the lightly doped drain to be H2. Both the two different lengths of the lightly doped drains H1, H2 can be used in the present invention.

In this embodiment, the first, the second, the third and the fourth length of the lightly doped drains 240, 242, 244, 246 are designed with 3 unit of length, 1 unit of length, 1 unit of length, and 1 unit of length respectively. The length of the first lightly doped drain is lengthened to decrease the leakage current, and the length of the first lightly doped drain is longer than that of other lightly doped drains to increase the total resistance of the leakage current path from the node A to the node B for decreasing the leakage current.

The other lightly doped drains can be shortened or even canceled because the lengths of the other three lightly doped drains will not influence the leakage current problem. The shortened lengths of the lightly doped drains can decrease the series resistor from the source 240 to the drain 245 and raise the speed of the electric drift and the operation speed of the component. In other words, the lengths of the other three lightly doped drains can be designed to be smaller than the length of the first lightly doped drain.

Compared with the structure of the conventional symmetric LDD-TFT, the present invention is employing the asymmetric LDD-TFT which is defined by lengthening the length of the lightly doped drain at one side of the LDD-TFT for decreasing the leakage current from the side of the LDD-TFT which is sensitive to the leakage current problem.

In the present invention, the proportion of the lengths of the lightly doped drains of the dual gate LDD-TFT can be adjusted arbitrarily according to the design requirement. For instance, the first length is longer than each of the second, third and fourth lengths, and the second, third and fourth lengths can be different to each other; the first and third lengths are equivalent to each other, the second and fourth lengths are equivalent to each other, and the first length is longer than the second length; and the first and second lengths are equivalent to each other, the third and fourth lengths are equivalent to each other, the first length is longer than the third length.

Even only the dual gate asymmetric LDD-TFT is illustrated in the embodiment of the present invention, but the design and manner can also be employed in a single gate asymmetric LDD-TFT, and further can be employed in a bottom-gate LDD-TFT to obtain the same effect.

In general, when the TFT is turned off, the electric field between the source and the substrate is still existent to result in the leakage current. It means that the source region of the TFT is sensitive to the leakage current. Therefore, in the present invention, the length of the lightly doped drain which is closed to the source is lengthened to decrease the leakage current, and the other lightly doped drains can be canceled or shortened to decrease the series resistance from the drain to the source and to raise the speed of the electric drift and the operation speed of the component.

Compared with the structure of the conventional symmetric LDD-TFT, the LDD-TFT employed in the present invention comprises asymmetric lightly doped drains by lengthening the length of the lightly doped drain closed to the source for decreasing the leakage current from the side of the LDD-TFT which is sensitive to the leakage current problem. Besides, the length of the lightly doped drain closed to the drain can be shortened or canceled to decrease the series resistance from the drain to the source and to raise the speed of the electric drift and the operation speed of the component.

Although the present invention and its advantages have been described in detail, as well as some variations over the disclosed embodiments, it should be understood that various other changes, substitutions and alterations can be made herein without departing from the spirit and scope of the invention as defined by the appended claims.

We claim:

1. A pixel circuit for driving a plurality of pixel units on a panel of a display, the pixel circuit comprising:
   a plurality of scanning lines, disposed on the panel of the display, for transmitting scanning signals to the pixel units;
   a plurality of data lines, disposed on the panel of the display and transversely crossing the scanning lines, for transmitting data signals to the pixel units;
   a plurality of driving transistors; and
   a plurality of dual gate lightly doped drain thin film transistors (LDD-TFTs), each being coupled to a corresponding scanning line, a corresponding data line and a corresponding driving transistor, each dual gate LDD-TFT including a first gate, a second gate, a first lightly doped drain having a first length, a second lightly doped drain having a second length, a third lightly doped drain having a third length, and a fourth lightly doped drain having a fourth length, the first gate being cooperated with the first and second lightly doped drains, the second gate being cooperated with the third and fourth lightly doped drains,
   wherein the first lightly doped drain is the longest in length among the four lightly doped drains and is the one closest to the driving transistor, a heavily doped region is formed in between the second lightly doped drain and the third lightly doped drain, and the first gate and the second gate are formed and patterned by a same single layer.

2. The pixel circuit according to claim 1, wherein the first and second lengths are equivalent to each other, the third and fourth lengths are equivalent to each other, and the first length is longer than the third length.

3. A pixel circuit for driving an active matrix light emitting display, comprising:
   a dual gate lightly doped drain thin film transistor (LDD-TFT) adapted to be turned on in response to a scanning signal so as to transmit a data signal therethrough, the dual gate LDD-TFT including a first gate, a second gate, a first lightly doped drain having a first length, a second lightly doped drain having a second length, a third lightly doped drain having a third length, and a fourth lightly doped drain having a fourth length, wherein the first gate being cooperated with the first and second lightly doped drains, the second gate being cooperated with the third and fourth lightly doped drains;
   a driving transistor for permitting a current therethrough to convey the data signal; and
   a light emitting diode (LED) driven by the current through the driving transistor,
   wherein the first lightly doped drain is the longest in length among the four lightly doped drains and is the one closest to the driving transistor, a heavily doped region is formed in between the second lightly doped drain and the third lightly doped drain, and the first gate and the second gate are formed and patterned by a same single layer.

4. The pixel circuit according to claim 3, wherein the first and second lengths are equivalent to each other, the third and fourth lengths are equivalent to each other, and the first length is longer than the third length.

5. The pixel circuit according to claim 1, wherein the ratio of the first, the second, the third and the fourth length are 3:1:1:1.

6. The pixel circuit according to claim 1, wherein the first and the second LDD lengths are equivalent to each other, the first length is longer than the third and the fourth lengths.

7. The pixel circuit according to claim 1, wherein the first length is longer than the second length, the second length is longer than the third length, and the third length is longer than the fourth length.

8. The pixel circuit according to claim 3, wherein the ratio of the first, the second, the third and the fourth length are 3:1:1:1.

9. The pixel circuit according to claim 3, wherein the first and the second lengths are equivalent to each other, the first length is longer than the third and the fourth lengths.

10. The pixel circuit according to claim 3, wherein the first length is longer than the second length, the second length is longer than the third length, and the third length is longer than the fourth length.

* * * * *